United States Patent [19]
Evans
[11] 3,760,822
[45] Sept. 25, 1973

[54] MACHINE FOR CLEANING SEMICONDUCTIVE WAFERS

[76] Inventor: Arthur Evans, Sunset Hill Rd., Brookfield Center, Conn. 06805

[22] Filed: Mar. 22, 1972
[21] Appl. No.: 236,835

[52] U.S. Cl. 134/99, 118/48, 118/50, 118/52, 134/140, 134/149, 269/20
[51] Int. Cl. B08b 3/10
[58] Field of Search 118/50, 50.1, 500, 118/48–49.5; 134/99, 102, 149; 15/302; 269/20; 279/3; 117/1 NQ; 29/203 V

[56] References Cited

UNITED STATES PATENTS

| | | | |
|---|---|---|---|
| 1,707,232 | 4/1929 | Naess | 134/149 |
| 1,914,016 | 6/1933 | Hobi | 134/149 X |
| 3,489,608 | 1/1970 | Jacobs et al. | 134/149 X |
| 3,538,926 | 11/1970 | Nesbitt | 134/102 |

*Primary Examiner*—Morris Kaplan
*Attorney*—Michael Ebert

[57] ABSTRACT

An automatic production machine useful in the fabrication of integrated circuits for coating semiconductive wafers and microelectric substrates with photosensitive films. The machine is provided with a multi-deck spinner including a motor-driven turntable having a vertical stack of vacuum chucks mounted thereabove. The chucks are supported one above the other and are cantilevered from two parallel pipes extending upwardly from the rim of the turntable. Each chuck serves as a deck for supporting a wafer to be coated by centrifugal action. One pipe functions as a vacuum line manifold communicating with a pattern of grooves formed on the upper face of each chuck to hold the wafer thereto. The other pipe functions as a treatment line manifold to supply gas or a cleaning solvent to a port on the undersurface of each chuck, whereby the gas or solvent is dispensed onto the exposed surface of the wafer on the chuck therebelow.

8 Claims, 10 Drawing Figures

MACHINE FOR CLEANING SEMICONDUCTIVE WAFERS

BACKGROUND OF THE INVENTION

This invention relates generally to the manufacture of integrated circuits as well as transistors and diodes, and in particular to an automatic production machine for coating semiconductive wafers and microelectric substrates with photosensitive films.

Many circuits and complex multi-stage electronic systems that previously were regarded as economically unfeasible and impractical, are now realizable with integrated circuits. With the rapidly growing market for integrated circuits, a demand has arisen for large-volume production techniques.

The fabrication of a single-crystal monolithic circuit involves the formation of diodes, transistors, resistors and capacitors on a single substrate, with sufficient isolation between the components of the total circuit to minimize parasitic interaction therebetween.

In fabricating an integrated circuit, the first phase is a photo resist and oxide-masking process. Because the diffusion constant of typical impurities is much smaller in silicon dioxide than in silicon, a very thin layer (typically one micron) of $SiO_2$ is used on a silicon wafer to selectively control areas in which diffusion of impurities takes place. In those areas where diffusion into the silicon wafer is desired, the layer of $SiO_2$ is removed by etching. If impurity atoms are now applied uniformly to the entire surface and the wafer heated, diffusion takes place into the exposed silicon, but there is no diffusion into the $SiO_2$ and the silicon beneath it. Thus the oxide layer acts as a "mask" during the diffusion cycle.

A photographic technique is employed to implement the etching of apertures in $SiO_2$. The surface of $SiO_2$ is uniformly coated with a material known as "photo resist." A glass mask containing a pattern of opaque and transparent regions is placed in contact with the photoresist layer, and the assembly is exposed to ultraviolet light. This brings about a polymerization in the photoresist layer which makes those areas which have been exposed insoluble in the developing solution. The developer is used to remove the unexposed photo resist.

Exposed photo resist is also insoluble in hydrofluoric acid, which may now be used to remove the areas of $SiO_2$ not covered by photo resist. While the hydrofluoric acid removes $SiO_2$, it does not react with silicon. Thus, at this point in the process, certain areas of the silicon surface are exposed, while the remainder are covered with $SiO_2$ and photo resist. The photo resist is next removed with hot sulfuric acid and the wafer is now ready for the diffusion process.

The diffusion is performed in an oxidizing or doped atmosphere, and a new layer of $SiO_2$ is grown on the wafer. At the termination of each diffusion cycle, the entire wafer is covered by $SiO_2$. The areas in which succeeding diffusions occur are controlled by repeating the photo-resist process.

From the foregoing, it will be evident that the production rate for integrated circuit fabrication is in good part determined by the rate at which it is possible to coat wafers with photo resist material. In practice, a single wafer may come back for as many as ten coats at different stages in the manufacturing process. It is not only essential, therefore, that the coating technique be carried out expeditiously, but also that the thickness of the photo-resist coating be perfectly uniform, for variations in thickness cannot be tolerated.

In one commercially available machine for coating wafers with photo-resist material, the wafer is placed on a spinner head and the photo-resist material is dispensed thereon, the material being caused to spread over the surface by reason of the centrifugal forces produced by the spinning action.

In order to speed up production rates, applicator machines have been developed in a modular design, each modular unit having four spinner heads, with each assembly of four heads having a separate drain and fume-exhaust system. By putting three modular units together in side-by-side relation, one then has available 12 heads for higher production rates.

Each head, in a multiple head machine, is driven by a separate D-C motor whose shaft is directly coupled to the head. In practice, the motors are heavily overdriven until they approach their preset speed in order to quickly accelerate the spinner heads. Each head is provided with an electrodynamic brake to stop the head quickly at the end of a cycle.

In a modular multi-head machine of the above-described type, the several heads all lie in the same horizontal plane, and the wafers or substrates to be coated are carried on trays having machined recesses therein for accommodating the semiconductive wafers or the glass or ceramic substrates to be coated. The trays are slotted to clear the spinner shafts when loading and unloading the machine.

Though a multi-head modular unit makes possible increased production rates, it has a number of practical drawbacks. Because each head is provided with a separate motor and a motor control system, a production set-up involving, say, 24 heads, becomes relatively complex and costly because of the equal number of motors and control systems entailed thereby. Moreover, with independently driven spinner heads, it is difficult to properly coordinate the operation of the various motors so that they all turn at exactly the same speed.

Moreover, a modular unit in which all heads lie in the horizontal plane does not lend itself to automatic wafer loading and unloading, for the heads are distributed throughout a horizontal array, rather than one above the other, the latter arrangement being better conducive to automatic loading by means of a multi-decked movable rack conveying wafers to be processed.

SUMMARY OF THE INVENTION

In view of the foregoing, it is the main object of this invention to provide a multi-decked machine for coating semiconductive wafers and microelectric substrates with photosensitive films, the machine being capable of exceptionally high production rates.

More specifically, it is an object of the invention to provide a machine of the above type, having a vertical stack of vacuum chucks for receiving wafers or substrates to be coated, the stack being supported on a common turntable driven by a single heavy-duty motor, whereby the same motor serves to spin all of the wafers concurrently at the same speed.

It is to be understood that while the invention will be described as it operates to coat wafers, the same mechanism is useful for a variety of other applications in which parts are to be washed, dried, or coated or developed in large quantities. For example, the process employed to coat wafers may also be used in manufacturing the mask, which generally is a glass plate of from 30/1000 to 60/1000 of an inch thick.

Also an object of the invention is to provide a drive motor system for the multi-decked spinner that is capable of extremely high acceleration to effect a thin and uniform coating of the wafer or substrate.

Briefly stated, these objects are accomplished in an automatic applicator machine for coating wafers and substrates, the machine being provided with a multi-decked spinner assembly including a motor-driven turntable having a vertical stack of vacuum chucks mounted thereabove. The several chucks which are supported one above the other are all cantilevered from two parallel pipes extending upwardly from the rim of the turntable. Each chuck serves as a deck for supporting a wafer to be coated by centrifugal action.

One pipe functions as a vacuum line manifold communicating with a pattern of grooves formed in the upper face of each chuck to hold the wafer thereto. The other pipe functions as a treatment line manifold to supply an inert gas or a cleaning solvent to a port on the underface of each chuck, whereby the gas or solvent is dispensed onto the exposed surface of the wafer on the chuck below. The purpose of the solvent is to clean the wafer surface before the photo-resist is applied thereto and the purpose of the gas is to effect drying of the solvent, so that no trace of solvent is present in the photoresist layer.

A flywheel is mounted on the motor shaft, the flywheel being coupled by a clutch and brake to a drive pulley linked by a belt to the shaft of the spinner turntable. Control of acceleration is critical in proper coating of wafers, the flywheel serving this vital function.

Before the flywheel is operatively coupled by the clutch to the spinner turntable, the flywheel is brought by the associated motor up to a speed exceeding that normally required for spinning in order to store energy in the flywheel. The clutch is then activated to couple the rotating flywheel to the spinner load. The load acts to retard flywheel motion, causing the flywheel energy to be discharged during the acceleration curve of the spinner to a degree at which the resultant speed of the spinner and the flywheel is lessened to a level corresponding to the desired spinning rate, so that at no time does the spinner turn at a speed above a preset value.

OUTLINE OF THE DRAWING

For a better understanding of the invention, as well as other objects and further features thereof, reference is made to the following detailed description to be read in conjunction with the accompanying drawings, wherein:

FIG. 6 is a detail of FIG. 3, showing the spiral-groove formation on the upper face of the chuck;

FIG. 9 is a section taken through the assembly in the plan indicated by line 9—9 in FIG. 7.

DESCRIPTION OF THE INVENTION

Figures 1, 7:
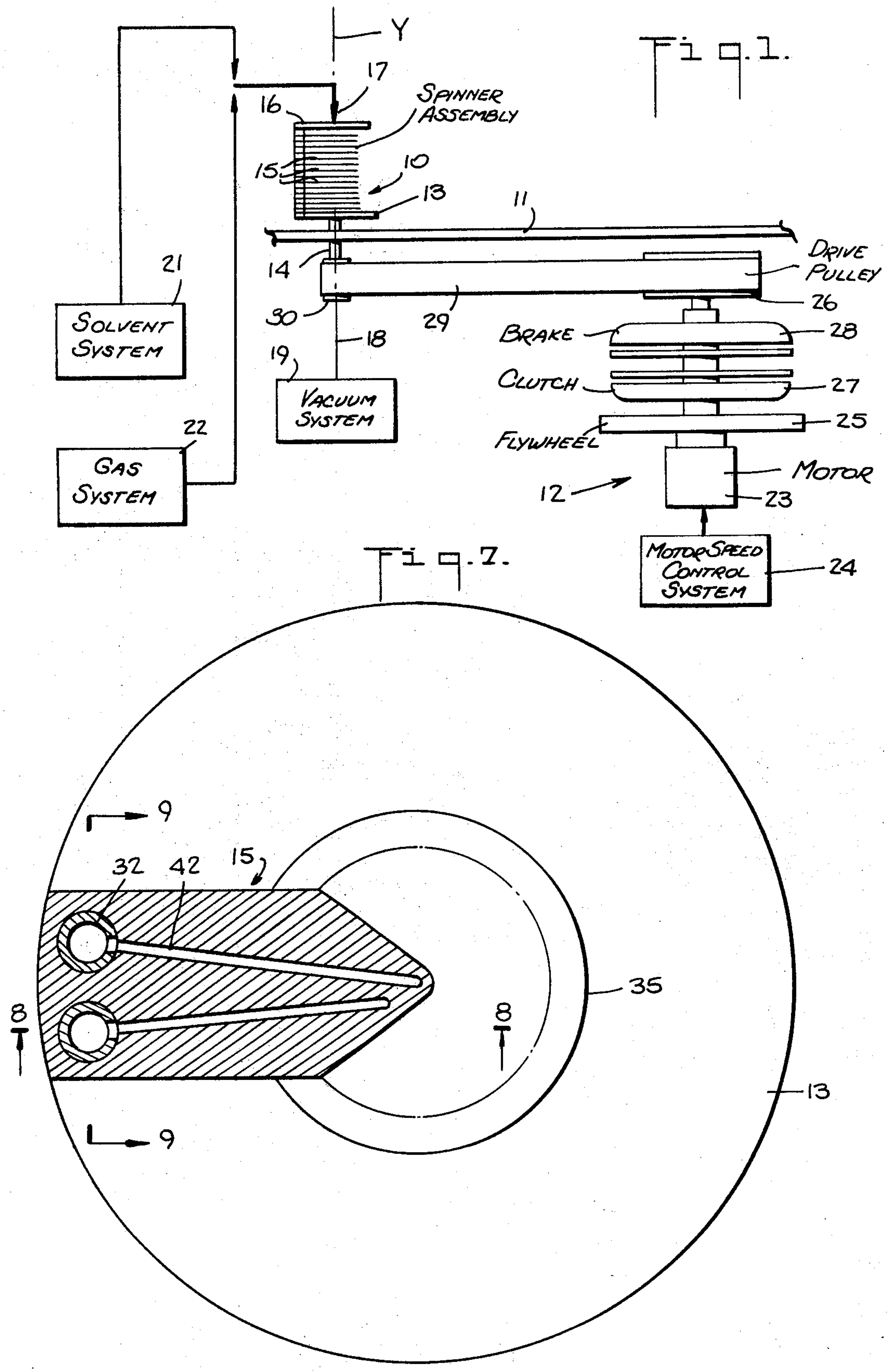
FIG. 1 is a schematic diagram of an automatic applicator machine in accordance with the invention.
FIG. 7 is a plan view of the turntable of the spinner assembly and the first chuck in the stack mounted thereon.

Referring now to FIG. 1, there is shown a machine in accordance with the invention, for simultaneously coating a plurality of wafers or substrates with photoresist material, or for carrying out other steps involved in the fabrication of integrated circuits, and other semiconductor devices.

The machine is constituted by a multi-deck spinner assembly, generally designated by numeral 10, which is mounted above the table 11 of a suitable cabinet or housing, and a drive system for the spinner assembly, the drive system generally designated by numeral 12, being disposed in the cabinet below table 11.

The machine in no way alters the accepted process now being practiced for spinning a semi-conductive wafer on its center line (indicated by vertical axis Y), using very high accelerations and speeds up to a maximum of 12,000 RPM. The unique feature of the machine resides in its ability to simultaneously process a large number of wafers or substrates in a vertical stack with a common drive system, thereby increasing the production of a single-headed spinner by the number of wafers stacked on the decks of the spinner assembly.

In the embodiment shown, the spinner assembly 10 is constituted by a turntable 13 whose hollow spindle 14 is supported for rotation in a bearing on table 11. A stack of 25 vacuum chucks 15 is mounted on the turntable, all vacuum chucks serving as a deck for accommodating a wafer to be processed.

The stack is covered by a cover plate 16 provided with a hollow shaft 17 in line with the hollow spindle of the turntable. The hollow spindle 14 of the turntable is coupled by a rotary seal to a pipe 18 going to a vacuum pump 19. The vacuum lines lead to a groove pattern on the chucks in the deck to hold the wafers thereto. Hollow shaft 17 on cover plate 16 is coupled through a rotary seal to a solvent supply 21 or to a nitrogen supply 22. The treatment lines which supply the gas or solvent lead to discharge ports on the chucks.

We shall later consider the spinner assembly in greater detail in connection with the other figures. Our immediate concern in FIG. 1 is the manner in which acceleration of the spinner assembly is controlled by drive system 12 to effect an extremely high acceleration thereof.

Drive system 12 includes a heavy-duty electric motor 23 whose speed is adjustable by means of a suitable control circuit 24. Mounted on the shaft of motor 23 is a flywheel 25 which is coupled to a drive pulley 26 through an electrodynamic clutch 27 and an electromagnetic brake 28. Drive pulley 26 is linked by a belt 29 to a pulley 30 mounted on the spindle of turntable 13.

In operation, when motor 23 is energized, flywheel 25 is rotated, and when clutch 27 is thereafter activated, the flywheel is operatively coupled to drive pulley 26 to cause rotation of the spinner assembly. When motor 23 is de-energized, the flywheel is de-coupled from the drive pulley, but the spinner assembly, because of inertia, continues to rotate. Such contained rotation is immediately arrested by activating brake 28.

Since very high acceleration is necessary to produce smooth, uniform coatings, the procedure for this purpose involves first running the flywheel at a higher speed than the normal operating speed before the flywheel is coupled to the drive pulley, in order to store energy in the flywheel. When the flywheel is rotating at the higher speed, it is then coupled to drive pulley 26 by activating clutch 27 so that now the flywheel is loaded by the spinner assembly.

The load imposed on the flywheel tends to retard its motion. The energy stored in the flywheel is discharged during the acceleration curve of the spinner assembly, causing the spinner assembly to quickly assume the speed of the flywheel which, in the loaded state, turns at the desired normal rate. Thus, the spinner assembly is never operated above the desired RPM rate and is caused to accelerate very rapidly from zero to the predetermined rotary rate.

In practice, the entire spinner assembly is surrounded by a protective steel enclosure equipped with an automatic door-opening mechanism that admits a rack holding the wafers to be processed in a vertical stack, the rack automatically loading the wafers on the decks of the spinner assembly. Also provided is a track mechanism provided with photo-resist depensing tubes in a vertical array which enter through the door of the enclosure to deposit photo-resist material and to then retract, after which the door is automatically closed, and the spinning cycle begins.

The door opening mechanism and the associated means for loading the wafers on the spinner assembly, and for dispensing the photo-resist material, form no part of the present invention which is directed to a coating machine having a multideck spinner assembly that may be manually as well as automatically loaded.

Figure 2:
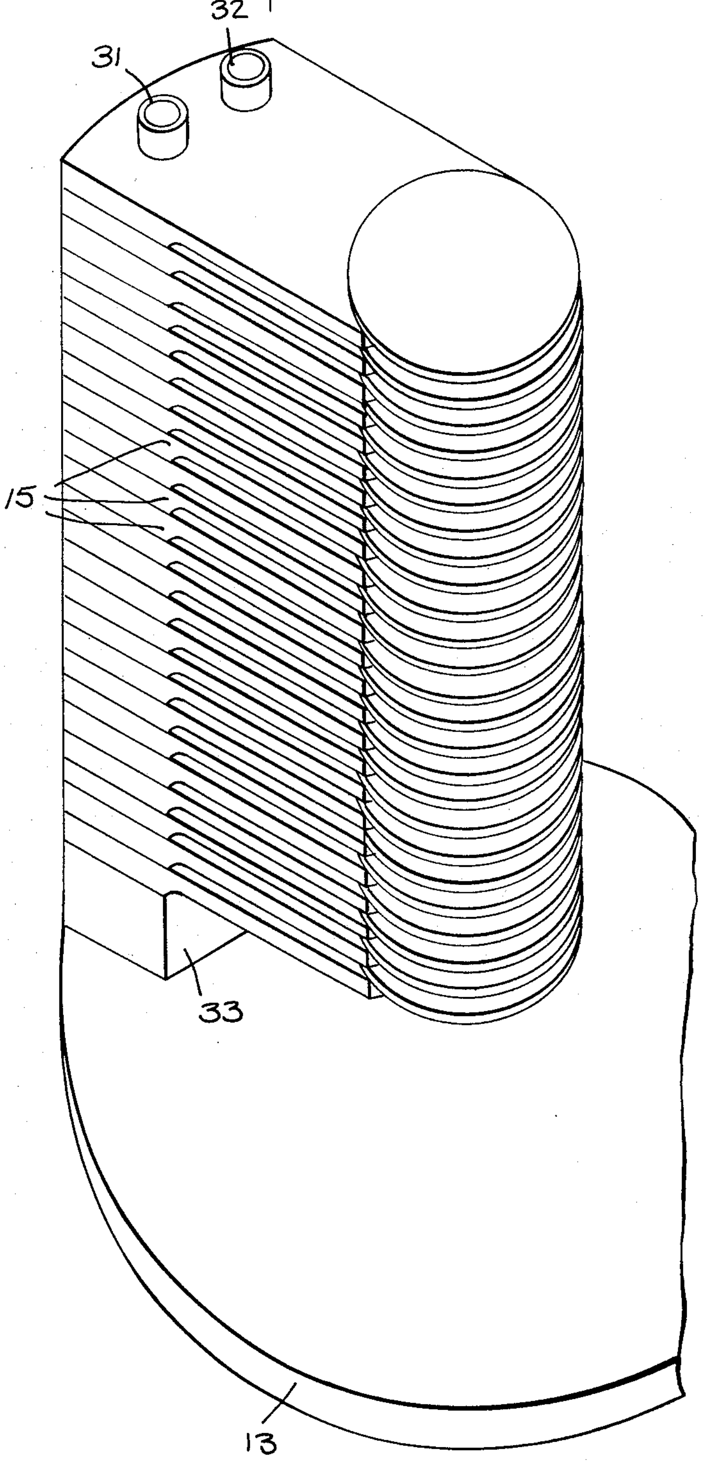
FIG. 2 is a perspective view of the multi-deck spinner assembly included in the machine, the cover plate being removed to expose the stack of vacuum chucks therebelow.
Figures 8, 10:
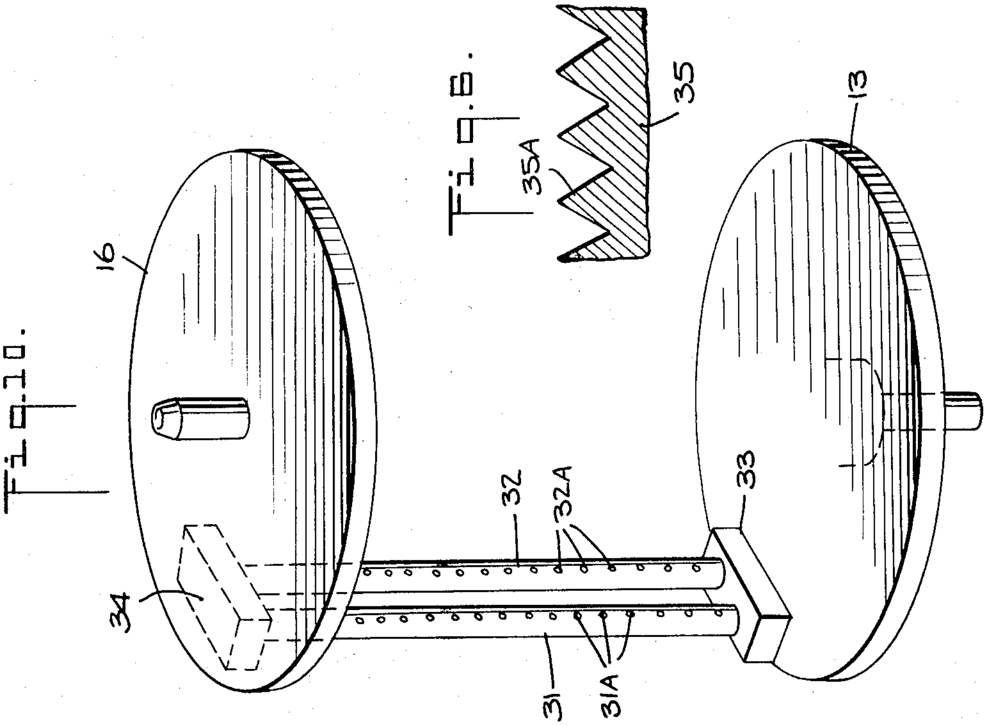
FIG. 10 is a perspective view illustrating the turntable and the cover plate of the spinner assembly.
Figure 3:
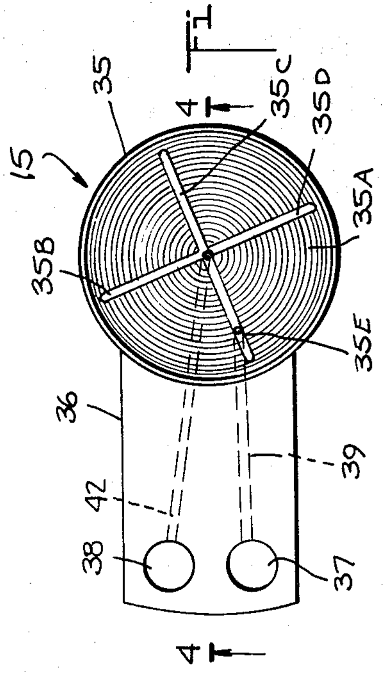
FIG. 3 shows as individual vacuum chuck in top plan view.
Figure 4:
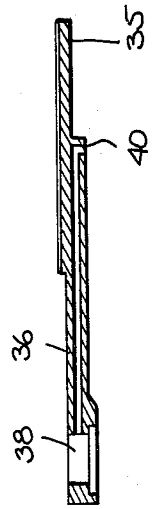
FIG. 4 is a longitudinal section taken through the chuck shown in FIG. 3, in the plane indicated by line 4—4 therein.
Figure 5:
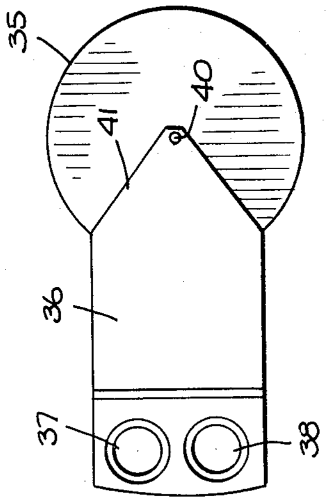
FIG. 5 is a bottom plan view of the chuck.
Figure 8:
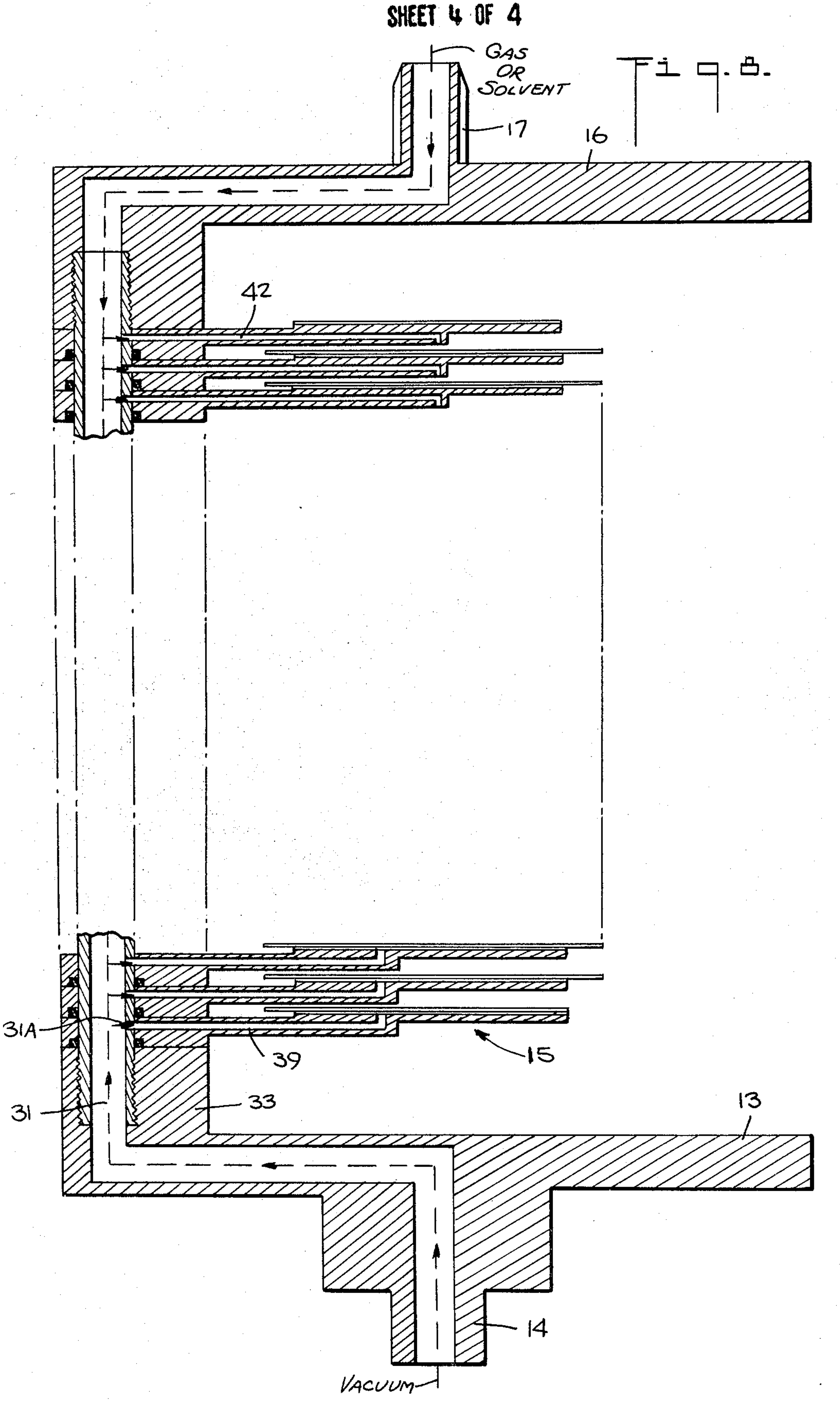

Referring now to FIG. 2, there is shown the turntable 13 of the spinner assembly, and the stack of vacuum chucks 15 mounted thereon, the cover plate being omitted. The chucks are cantilevered from two manifold pipes 31 and 32, which extend upwardly in parallel relation from a block 33 adjacent the rim of the turntable. The pipes, as shown in FIG. 10, terminate in a complementary block 34 mounted adjacent the rim of cover plate 16.

Pipe 31 serves as a vacuum manifold and is provided along its length with a series of spaced holes 31A which communicate the ducts in the assocated chucks leading to vacuum grooves. Pipe 32 serves as nitrogen and cleaning solvent manifold, and is provided with a like series of spaced holes 32A along its length which communicate with ducts in the associated chucks leading to a dispensing port.

Referring now to FIGS. 3, 4, 5, 6, showing an individual vacuum chuck 15, it will be seen that each chuck is provided with a circular platform 35 having a rectangular apron 36 provided with a pair of bores 37 and 38 to receive the vertical pipes 31 and 32, respectively. The bores are countersunk to receive suitable sealing rings.

The upper face of platform 35 is formed with a spiral groove 35A (see FIG. 6) which is interrupted by four radial grooves 35B, 35C, 35D, 35E, displaced ninety degrees from each other. This pattern of grooves assures the distribution of vacuum force along the entire surface of the wafer to securely hold the wafer to the platform.

A duct 39 extends between an opening in the edge of a bore 37 and an opening disposed in groove 35E, thereby providing a connection between a hole in the vacuum line manifold pipe 31 and the pattern of grooves on the upper face of the chuck platform. In practice, a wafer to be coated is placed on the upper face of the chuck platform and is held thereon by vacuum pressure.

The underface of platform 35 is provided with a central dispensing port 40 which is formed at the apex of a triangular extension 41 of apron 36. Port 40 is connected by a duct 42 to an opening in the edge of bore 38 which receives the gas and solvent line manifold pipe 32 and is in registration with hole 32A in this pipe.

Figure 8:
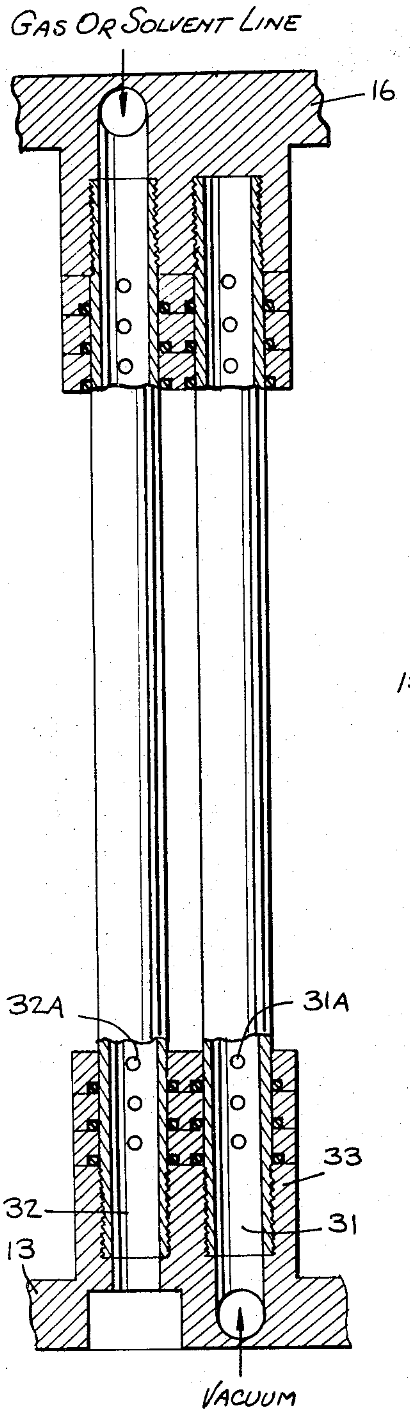
FIG. 8 is a section taken through the assembly in the plane indicated by line 8—8 in FIG. 7.

Referring now to FIGS. 7, 8 and 9, the manner in which the vacuum chucks 15, which are cantilevered from pipes 31 and 32, are supplied with vacuum as well as nitrogen and solvent, is shown by means of broken lines. The vacuum path, which is indicated by dash-dot-lines, goes from the vacuum pump through the hollow spindle 14 of turntable 13 and then through manifold pipe 31 to the holes 31A therein, which holes are in registration with the vacuum-line ducts in the chucks.

In these figures, only the first and last chucks are shown in the stack of 25, the intermediate chucks being omitted. It will be seen that the vacuum line goes to an opening in the upper faces of the first and last chucks.

The gas and solvent line, indicated by dashed lines, passes through the hollow shaft 17 of the cover plate 16 and then goes through manifold pipe 32 to the holes 32A therein, which holes are in registration with the treatment-line ducts in the chucks. It will be seen that the treatment line goes to the port in the lower faces of the chucks.

In operation, the solvent is dispensed under pressure, using nitrogen for this purpose. After dispensing the solvent, the solvent line is closed by a suitable valve and nitrogen alone is used as a blow-off to dry the wafers while they are spinning. Thus the wafer on each chuck is held thereto by the vacuum drawn through the pattern of grooves on the top face of the chuck, whereas the solvent and gas blow-off, with respect to the wafer held on a particular chuck, is dispensed from the underface of the vacuum chuck above the wafer in question.

It is for this reason that the lowermost chuck has its solvent and gas duct blocked off, for there is no wafer therebelow. Hence an assembly of 25 vacuum chucks is capable of processing 25 wafers or substrates.

Spinning takes place about the center line of the wafers which are all aligned with vertical axis Y passing through the vertical axis of the turntable spindle. Because the vacuum chucks are cantilevered from the pipes extending upwardly from the rim of the turntable, the assembly is mechanically unbalanced. This may be corrected by suitably placed counter-weights to counterpose the spinner structure.

While there has been shown and described a preferred embodiment of machine for coating semiconductive wafers in accordance with the invention, it will be appreciated that many changes and modifications may be made therein without, however, departing from the essential spirit of the invention.

I claim:

1. A machine for treating wafers and microelectronic substrates in the fabrication of integrated circuits, transistors and diodes, said machine comprising:

A. a spinner assembly including a turntable having a vertical stack of vacuum chucks mounted thereabove, each chuck including a vacuum duct leading to grooves in the upper face thereof to hold a wafer thereto, and a treatment duct leading to a port in the under face thereof for dispensing gas and cleaning solvent onto the wafer on the chuck therebelow, and B. a motor system to drive said spinner assembly.

2. A machine as set forth in claim 1, wherein said chucks are cantilevered from a pair of pipes extending upwardly from the rim of said turntable, one pipe serving as a vacuum line manifold, and having holes communicating with the vacuum ducts of said chucks, said second pipe serving as a treatment line manifold having holes communicating with the treatment ducts of said chucks.

3. A machine as set forth in claim 1, wherein each chuck is provided with a pattern of grooves defined by a spiral groove on the upper face thereof, interrupted by radial grooves.

4. A machine as set forth in claim 2, wherein each chuck is constituted by a circular platform for supporting a wafer to be coated, the center of said platform being in line with the axis of rotation of the turntable, said platform having a rectangular apron provided with bores through which said pipes extend.

5. A machine as set forth in claim 2, wherein said assembly is provided with a cover plate maching said turntable and having a hollow shaft coupled by a rotary seal to a solvent or gas source, said hollow shaft being coupled by a duct extending through said plate to said treatment pipe.

6. A machine as set forth in claim 2, wherein said turntable is provided with a hollow spindle coupled by a rotary seal to a vacuum pump, said hollow spindle being coupled by a duct passing through said turntable to said vacuum manifold pipe.

7. A machine as set forth in claim 1, wherein said motor system includes a motor having a flywheel mounted on the shaft thereof, a clutch for operatively coupling said flywheel to said turntable, and a motor control circuit to operate said motor at a speed above normal speed before the clutch is activated.

8. A machine as set forth in claim 7, further including a brake interposed between said clutch and said turntable.

* * * * *